(12) United States Patent
Chuang et al.

(10) Patent No.: US 7,518,841 B2
(45) Date of Patent: Apr. 14, 2009

(54) ELECTROSTATIC DISCHARGE PROTECTION FOR POWER AMPLIFIER IN RADIO FREQUENCY INTEGRATED CIRCUIT

(75) Inventors: Che-Hao Chuang, Hsinchu (TW); Ming-Dou Ker, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 231 days.

(21) Appl. No.: 10/978,387

(22) Filed: Nov. 2, 2004

(65) Prior Publication Data

US 2006/0092590 A1 May 4, 2006

(51) Int. Cl.
*H02H 9/00* (2006.01)
(52) U.S. Cl. .................................................. 361/56
(58) Field of Classification Search ................ 361/91.1, 361/56
See application file for complete search history.

(56) References Cited

U.S. PATENT DOCUMENTS

| | | | |
|---|---|---|---|
| 5,528,188 A * | 6/1996 | Au et al. ..................... 327/310 |
| 5,629,544 A * | 5/1997 | Voldman et al. ............ 257/355 |
| 5,744,842 A | 4/1998 | Ker |
| 6,011,420 A * | 1/2000 | Watt et al. .................... 327/310 |
| 6,249,410 B1 | 6/2001 | Ker et al. |
| 6,385,021 B1 * | 5/2002 | Takeda et al. ................. 361/56 |
| 6,400,204 B1 * | 6/2002 | Davis ......................... 327/314 |
| 6,459,340 B1 | 10/2002 | Apel et al. |
| 6,476,646 B2 * | 11/2002 | Sim et al. ..................... 327/55 |
| 6,624,999 B1 | 9/2003 | Johnson |
| 6,970,336 B2 * | 11/2005 | Stockinger et al. ............ 361/56 |

* cited by examiner

*Primary Examiner*—Stephen W Jackson
*Assistant Examiner*—Scott Bauer
(74) *Attorney, Agent, or Firm*—Alston & Bird LLP

(57) ABSTRACT

A circuit for protecting a power amplifier from electrostatic discharge (ESD) that comprises a clamp circuit connected between a first power line and a connection line, and a detecting circuit connected between the connection line and a second power line for detecting whether an ESD event occurs at a conductive pad coupled to the power amplifier and activating the clamp circuit in response to an ESD event, wherein an ESD current due to the ESD event is conducted by the clamp circuit to the first power line.

33 Claims, 14 Drawing Sheets ated side for amplifying signals to be transmitted. The power amplifier circuit device includes semiconductor amplification elements such as metal-oxide-semiconductor field effect transistors ("MOSFETs") formed as an integrated circuit ("IC".)

ELECTROSTATIC DISCHARGE PROTECTION FOR POWER AMPLIFIER IN RADIO FREQUENCY INTEGRATED CIRCUIT

I. FIELD OF THE INVENTION

The present invention relates generally to electrostatic discharge ("ESD") protection, and more particularly, to a circuit and a method for protecting a power amplifier from ESD events.

II. BACKGROUND OF THE INVENTION

In a wireless communication apparatus such as a cell phone, a power amplifier circuit device is usually provided at a transmission side for amplifying signals to be transmitted. The power amplifier circuit device includes semiconductor amplification elements such as metal-oxide-semiconductor field effect transistors ("MOSFETs") formed as an integrated circuit ("IC".)

A semiconductor IC, however, is generally susceptible to an electrostatic discharge ("ESD") event, which may damage or destroy the IC. An ESD event is an electrical discharge of a current (positive or negative) for a short duration during which a large amount of current is provided to the IC. The high current may be built-up from a variety of sources, such as the human body and machines, referred to as the human body model ("HBM") and machine model ("MM"), respectively. An IC is particularly susceptible to the HBM and MM built-up during fabrication, transportation, or handling.

Diodes have been generally used for ESD protection in ICs because they can be easily implemented with relatively simple manufacturing processes. However, an ESD protection circuit using diodes alone may not be suitable for protecting a power amplifier circuit device from ESD events, as is explained below by reference to FIG. 1. FIG. 1 is a schematic diagram of a system 10 using a conventional ESD circuit for protecting a power amplifier. System 10 includes an ESD protection circuit 12, a conductive pad 14, and a power amplifier 16. ESD protection circuit 12 includes a first diode 12-1 coupled between a first power line VDD and conductive pad 14, and a second diode 12-2 coupled between conductive pad 14 and a second power line VSS. Conductive pad 14 is connected to a matching circuit 16-1, for example, an RLC circuit, of power amplifier 16 for receiving an output voltage of power amplifier 16. Power amplifier 16 is connected between first power line VDD and second power line VSS. The voltage level of VDD line is approximately 2.5 volts (V). Power amplifier 16 may output a voltage of approximately 2 VDD or 5V to conductive pad 14 during normal operation. The output voltage of 5V, greater than VDD plus the cut-in voltage (for example, 0.7V) of first diode 12-1, turns on first diode 12-1, which should not become conductive during normal operation. The unexpected turn-on of first diode 12-1 may cause malfunction of power amplifier 16.

Other examples of ESD protection for power amplifier circuit devices can be found in U.S. Pat. No. 6,459,340 to Apel et al., entitled "Power Amplifier Mismatch Protection with Clamping Diodes in RF Feedback Circuit" ("the '340 patent") and U.S. Pat. No. 6,624,999 to Johnson, entitled "Electrostatic Discharge Protection Using Inductors" ("the '999 patent"). The '340 patent discloses a circuit including a set of clamping diodes formed between terminals of a transistor acting as a power amplifier. The circuit may not quickly respond to an ESD event due to low conduction speed of the multiple diodes. The '999 patent discloses a circuit including an inductor coupled between an IC to be protected and an ESD clamping device. Since the inductor is formed external to the IC, the IC itself is not provided with ESD protection and may be exposed to an ESD event during transportation and handling.

BRIEF SUMMARY OF THE INVENTION

The present invention is directed to a circuit and a method that obviate one or more problems resulting from the limitations and disadvantages of the prior art.

In accordance with an embodiment of the present invention, there is provided a circuit for protecting a power amplifier from electrostatic discharge (ESD) that comprises a clamp circuit connected between a first power line and a connection line, and a detecting circuit connected between the connection line and a second power line for detecting whether an ESD event occurs at a conductive pad coupled to the power amplifier and activating the clamp circuit in response to an ESD event, wherein an ESD current due to the ESD event is conducted by the clamp circuit to the first power line.

Also in accordance with the present invention, there is provided a circuit for protecting a power amplifier from electrostatic discharge (ESD) that comprises a first clamp circuit connected between a first power line and a connection line, a second clamp circuit connected between the connection line and a second power line, and a detecting circuit connected between the connection line and the second power line for detecting whether an ESD event occurs at a conductive pad coupled to the power amplifier, wherein the detecting circuit activates the first clamp circuit in response to an ESD event to conduct an ESD current to the first power line, and activates the second clamp circuit in response to the ESD event to conduct the ESD current to the second power line.

Further in accordance with the present invention, there is provided a circuit for protecting a power amplifier from electrostatic discharge (ESD) that comprises a first clamp circuit connected between a first power line and a connection line, a second clamp circuit connected between the first power line and a second power line, a first detecting circuit connected between the connection line and the second power line for detecting whether an ESD event occurs at a conductive pad coupled to the power amplifier, and activating the first clamp circuit in response to the ESD event to conduct an ESD current to the first power line, and a second detecting circuit connected between the first and second power lines for detecting whether an ESD event occurs on the first power line, and activating the second clamp circuit in response to the ESD event to conduct an ESD current to the second power line.

Still in accordance with the present invention, there is provided a method for protecting a power amplifier from electrostatic discharge (ESD) that comprises providing a first power line and a second power line, providing a connection line between the first and second power lines, connecting a clamp circuit between the first power line and the connection line, connecting a detecting circuit between the connection line and the second power line, coupling a conductive pad to the power amplifier, detecting whether an ESD event occurs at the conductive pad, activating the clamp circuit when an ESD event is detected, and conducting an ESD current from the conductive to the first power line.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the present invention and together with the description, serves to explain the principles of the invention.

BRIEF DESCRIPTION OF THE DRAWINGS

Reference will now be made in detail to the present embodiment of the invention, an example of which is illustrated in the accompanying drawings. Wherever possible, the same reference numbers are used throughout the drawings to refer to the same or like parts.

DETAILED DESCRIPTION OF THE INVENTION

Figure 1:
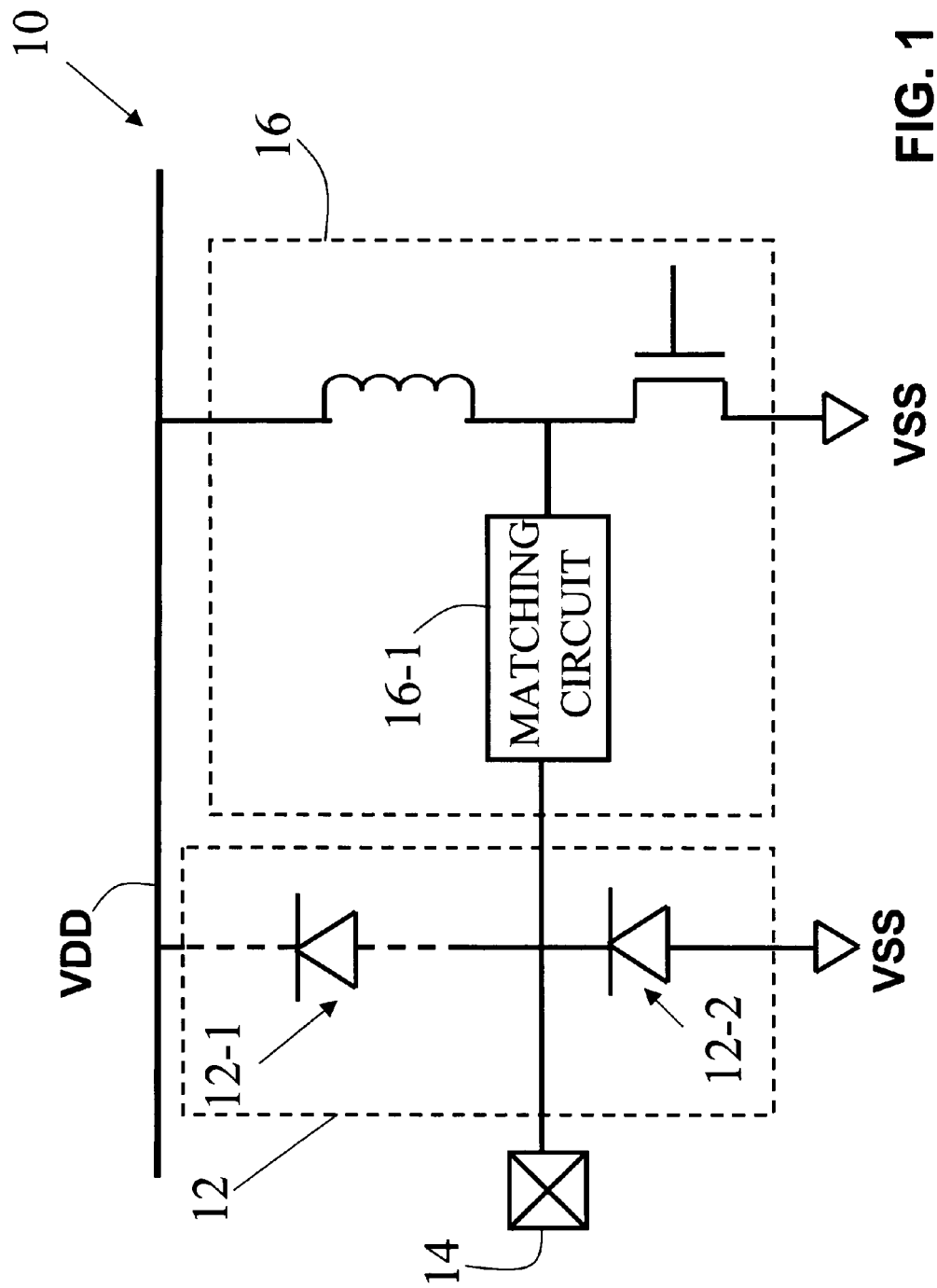
FIG. 1 is a schematic diagram of a system using a conventional electrostatic discharge ("ESD") circuit for protecting a power amplifier.
Figure 2:
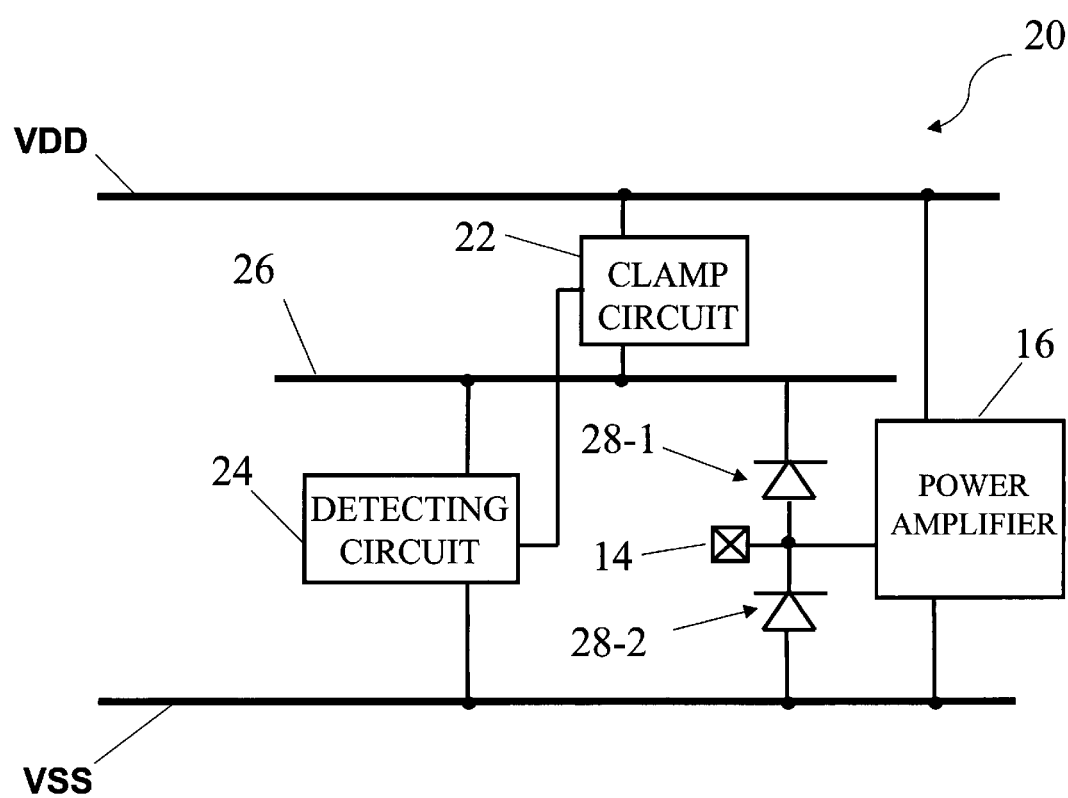
FIG. 2 is a diagram of a circuit for ESD protection in accordance with an embodiment of the present invention.

FIG. 2 is a diagram of a circuit 20 for electrostatic discharge ("ESD") protection in accordance with an embodiment of the present invention. Circuit 20 includes a clamp circuit 22 and a detecting circuit 24 for protecting a radio frequency core circuit 16 such as a power amplifier from ESD events. Clamp circuit 22 is connected between a first power line VDD and a connection line 26. Detecting circuit 24 is connected between a second power line VSS and connection line 26, and includes a terminal (not numbered) coupled to a terminal (not numbered) of clamp circuit 22. Circuit 20 further includes a first diode 28-1 and a second diode 28-2. First diode 28-1 is coupled between a conductive pad 14 and connection line 26. Second diode 28-2 is coupled between conductive pad 14 and second power line VSS. Conductive pad 14 serves as an output pad for transmitting signals from power amplifier 16.

In operation, when an ESD event occurs at conductive pad 14, detecting circuit 24 detects the ESD event and provides a signal to turn on clamp circuit 22. An ESD current due to the ESD event is conducted from conductive pad 14 through first diode 28-1, connection line 26 and clamp circuit 22 to first power line VDD. During normal operation, detecting circuit 24 turns off clamp circuit 22. The operation of detecting circuit 24 and clamp circuit 22 will be discussed in detail with respect to the circuit diagram shown in FIG. 7A.

Figure 3:
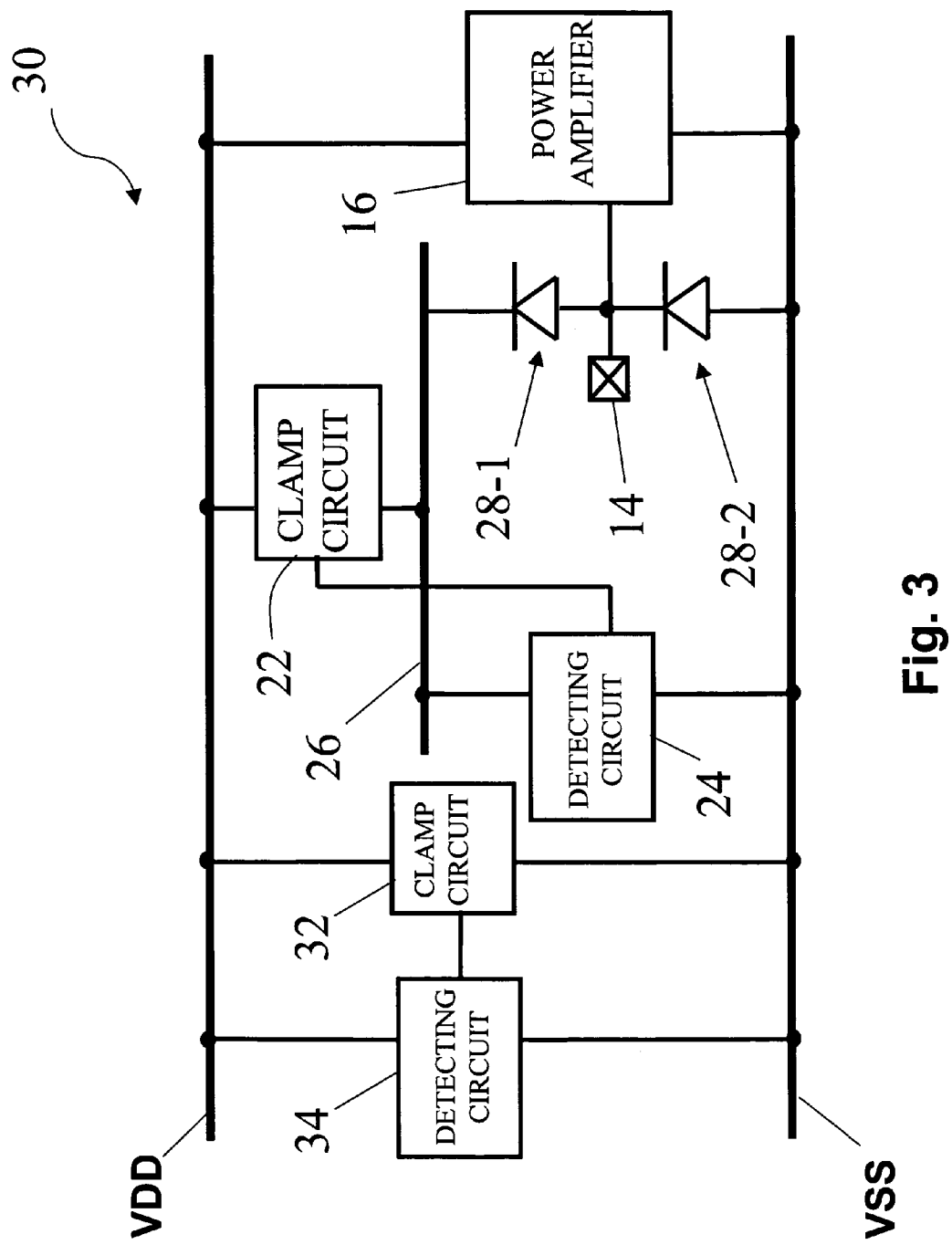
FIG. 3 is a diagram of a circuit for ESD protection in accordance with another embodiment of the present invention.

FIG. 3 is a diagram of a circuit 30 for ESD protection in accordance with another embodiment of the present invention. Circuit 30 has a similar circuit structure to circuit 20 shown in FIG. 2 except that another clamp circuit 32 and another detecting circuit 34 are added. Clamp circuit 32 is connected between first power line VDD and second power line VSS. Detecting circuit 34 is coupled between first power line VDD and second power line VSS, and includes a terminal (not numbered) coupled to a terminal (not numbered) of clamp circuit 32.

In operation, when an ESD event occurs on first power line VDD, detecting circuit 34 detects the ESD event and provides a signal to turn on clamp circuit 32. An ESD current due to the ESD event is conducted from first power line VDD through clamp circuit 32 to second power line VSS.

Figure 4:
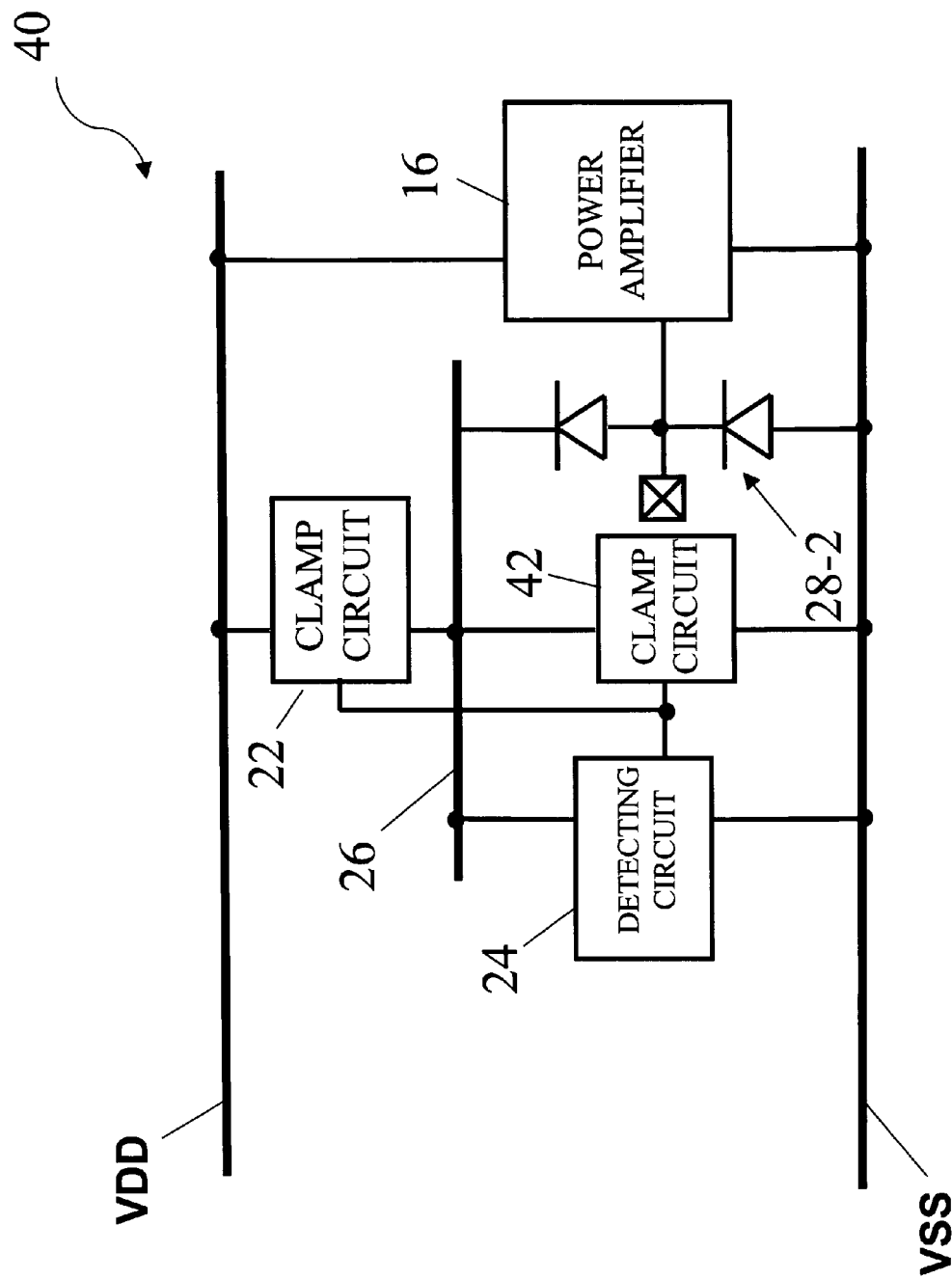
FIG. 4 is a diagram of a circuit for ESD protection in accordance with still another embodiment of the present invention.

FIG. 4 is a diagram of a circuit 40 for ESD protection in accordance with still another embodiment of the present invention. Circuit 40 has a similar circuit structure to circuit 20 shown in FIG. 2 except that another clamp circuit 42 is added. In the above embodiments regarding circuit 20 or circuit 30, an ESD event occurring at conductive pad 14 may cause breakdown of second diode 28-2. Clamp circuit 42 is provided to protect second diode 28-2 from breakdown by ESD events. Clamp 42 is connected between connection line 26 and second power line VSS, and includes a terminal (not numbered) coupled to the terminal of detecting circuit 24.

In operation, when an ESD event occurs at conductive pad 14, detecting circuit 24 detects the ESD event and provides a signal to turn on clamp circuits 22 and 42. An ESD current due to the ESD event is conducted in a first path from conductive pad 14 through first diode 28-1, connection line 26 and clamp circuit 22 to first power line VDD, or in a second path from conductive pad 14 through first diode 28-1, connection line 26 and clamp circuit 42 to second power line VSS. The second path through clamp circuit 42 protects second diode 28-2 from ESD events, which discharge through second diode 28-2.

Figure 5:
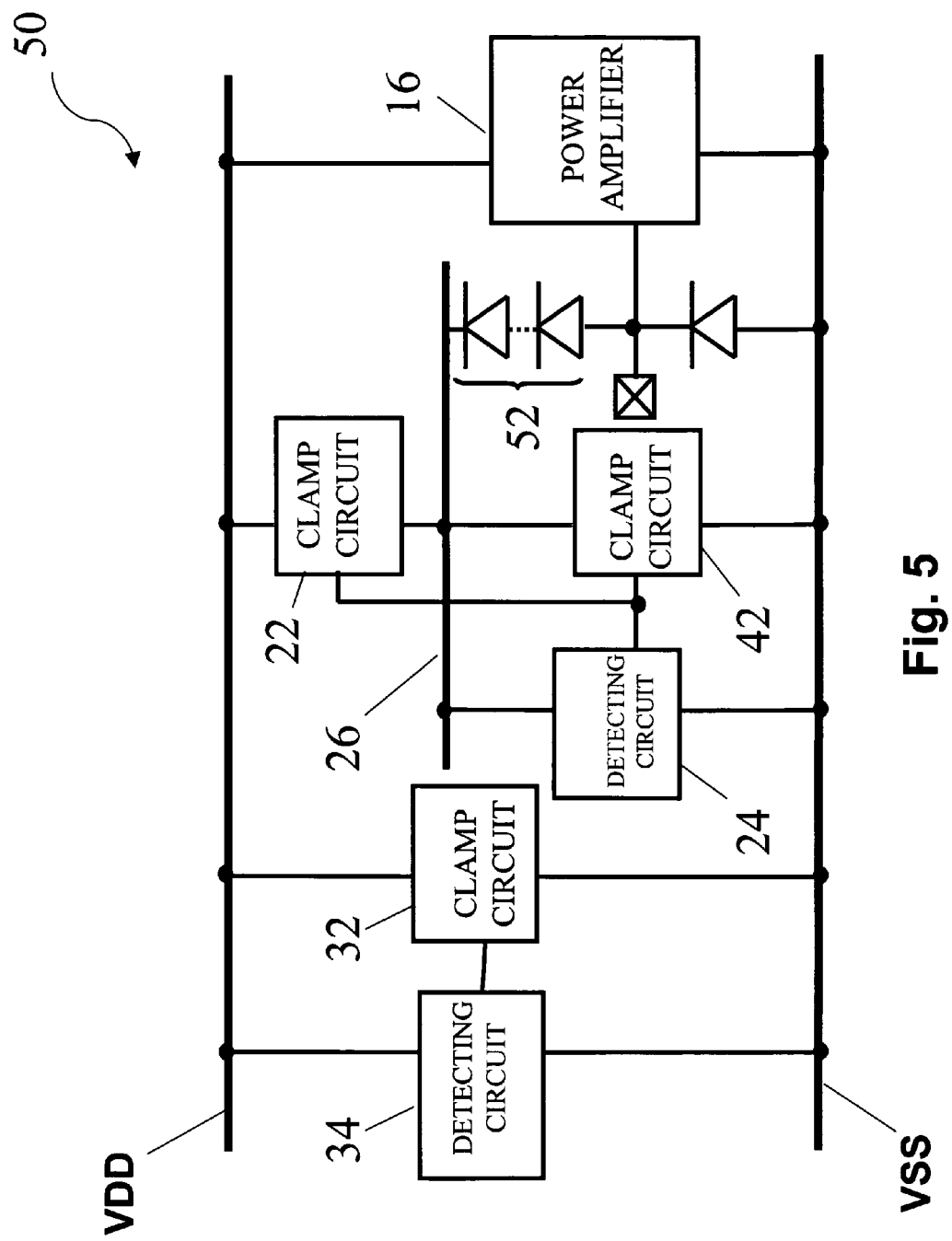
FIG. 5 is a diagram of a circuit for ESD protection in accordance with yet another embodiment of the present invention.

FIG. 5 is a diagram of a circuit 50 for ESD protection in accordance with yet another embodiment of the present invention. Referring to FIG. 5, all of the elements have been previously described except for first diode 52. As shown, first diode 52 includes a diode string to prevent clamp circuits 22 and 42 from false turn-on. If first diode 52 includes only one diode, when a voltage level at conductive pad 14 ($V_{PAD}$) during normal operation becomes greater than VDD plus the cut-in voltage of the diode ($V_{CUT-IN}$), i.e., $V_{PAD}$>VDD+$V_{CUT-IN}$, clamp circuit 22 or 42 may inadvertently turn on, which is undesirable.

Figure 6A:
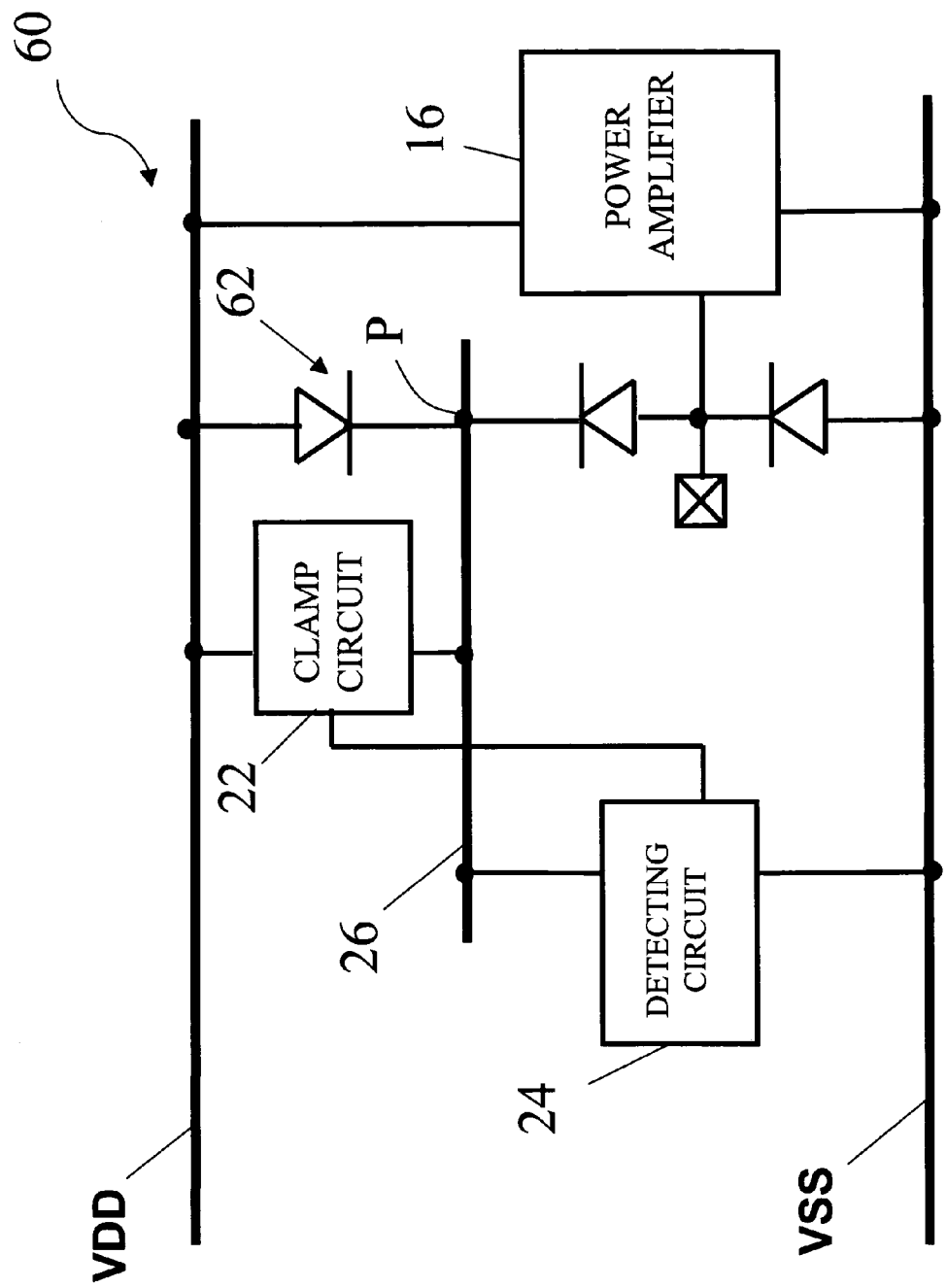
FIG. 6A is a diagram of a circuit for ESD protection in accordance with an embodiment of the present invention.

FIG. 6A is a diagram of a circuit 60 for ESD protection in accordance with an embodiment of the present invention. Circuit 60 has a similar structure to circuit 20 shown in FIG. 2 except that a third diode 62 is added. Third diode 62, coupled between first power line VDD and connection line 26, keeps the voltage on connection line 26 from floating. A floating connection line 26 may result in false operation of detecting circuit 24. When a voltage level at a point P ($V_P$) becomes approximately equal to VDD minus the cut-in voltage of the third diode 62 ($V_{D3}$), i.e., $V_P \approx VDD - V_{D3}$, third diode 62 is turned off. The voltage level of connection line 26 is clamped at a fixed level, $V_P$.

Figure 6B:
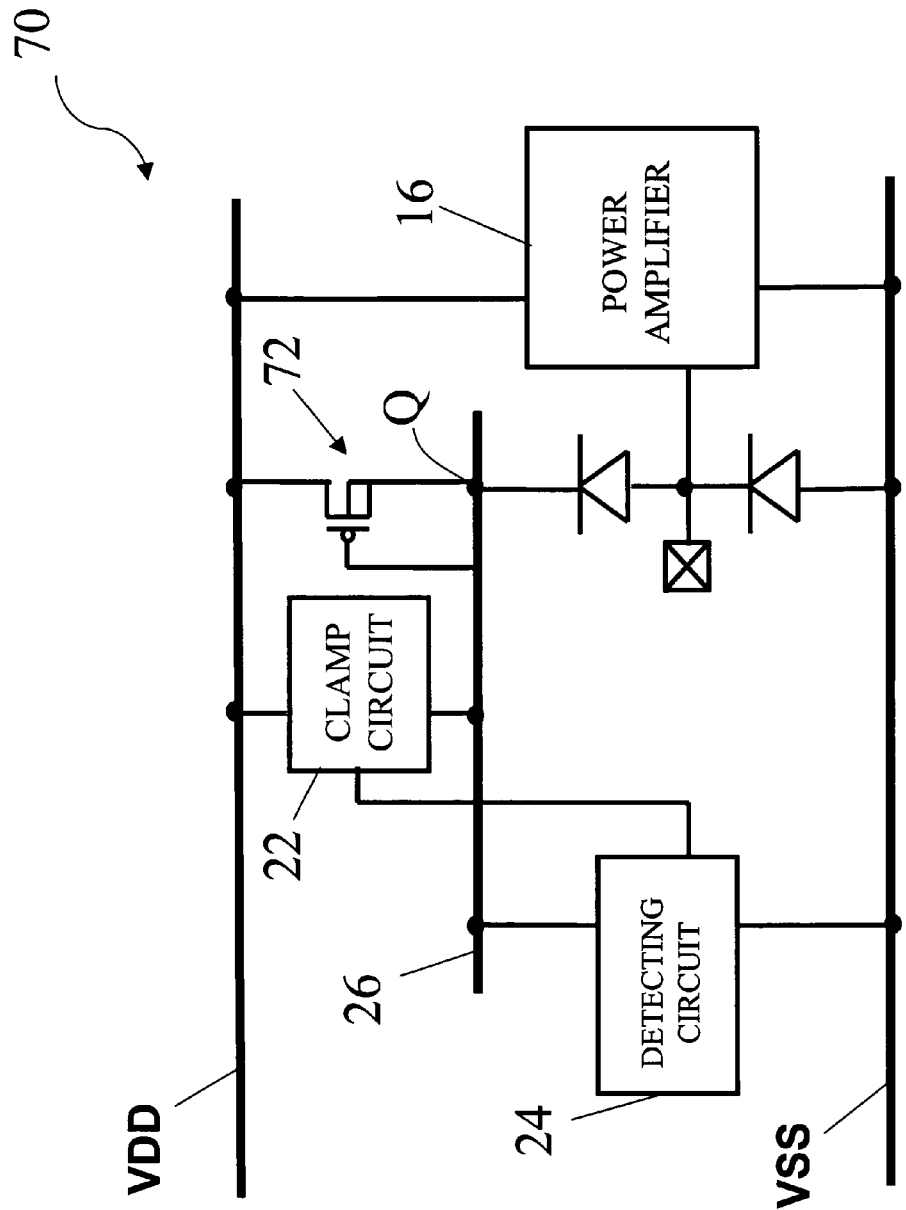
FIG. 6B is a diagram of a circuit for ESD protection in accordance with another embodiment of the present invention.

FIG. 6B is a diagram of a circuit 70 for ESD protection in accordance with another embodiment of the present invention. Circuit 70 has a similar circuit structure to circuit 60 shown in FIG. 6A except that a p-type metal-oxide-semiconductor ("PMOS") transistor 72 is used instead of third diode 62. PMOS transistor 72 includes a gate (not numbered) coupled to connection line 26, a source (not numbered) coupled to first power line VDD, and a drain and a substrate (both not numbered) coupled to connection line 26. When a voltage level at a point Q ($V_Q$) becomes approximately equal to VDD minus the threshold voltage of PMOS transistor 72 ($V_{THP}$), i.e., $V_Q \approx VDD-V_{THP}$, PMOS transistor 72 is turned off. The voltage level of connection line 26 is clamped at a fixed level, $V_Q$.

Figure 6C:
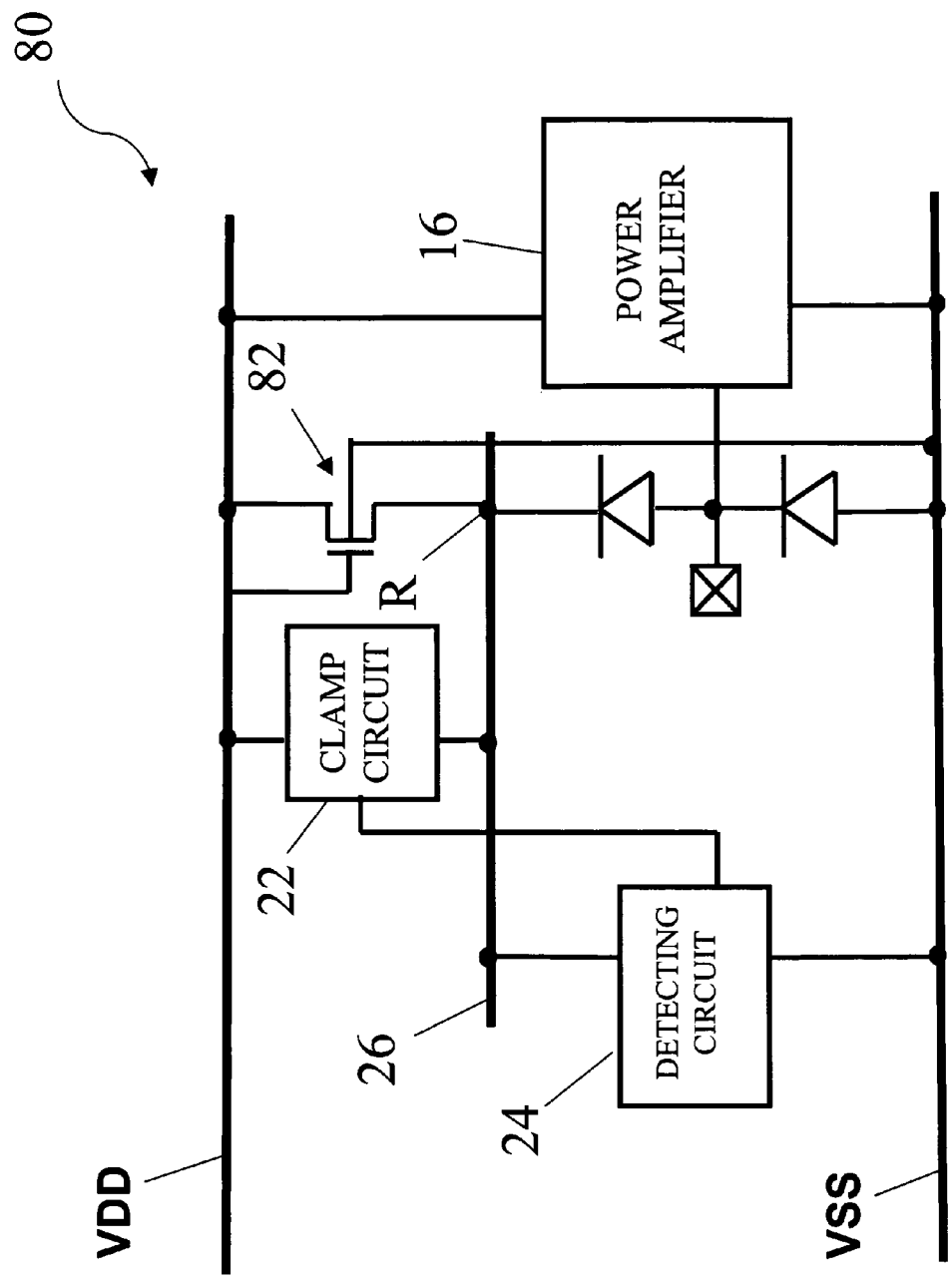
FIG. 6C is a diagram of a circuit for ESD protection in accordance with still another embodiment of the present invention.

FIG. 6C is a diagram of a circuit 80 for ESD protection in accordance with still another embodiment of the present invention. Circuit 80 has a similar circuit structure to circuit 60 shown in FIG. 6A except that an n-type metal-oxide-semiconductor ("NMOS") transistor 82 is used instead of third diode 62. NMOS transistor 82 includes a gate and a drain (not numbered) coupled to first power line VDD, a source (not numbered) coupled to connection line 26, and a substrate (not numbered) coupled to second power line VSS. When a voltage level at a point R ($V_R$) becomes approximately equal to VDD minus the threshold voltage of NMOS transistor 82 ($V_{THN}$), i.e., $V_R \approx VDD-V_{THN}$, NMOS transistor 82 is turned off. The voltage level of connection line 26 is clamped at a fixed level, $V_R$.

Figure 7A:
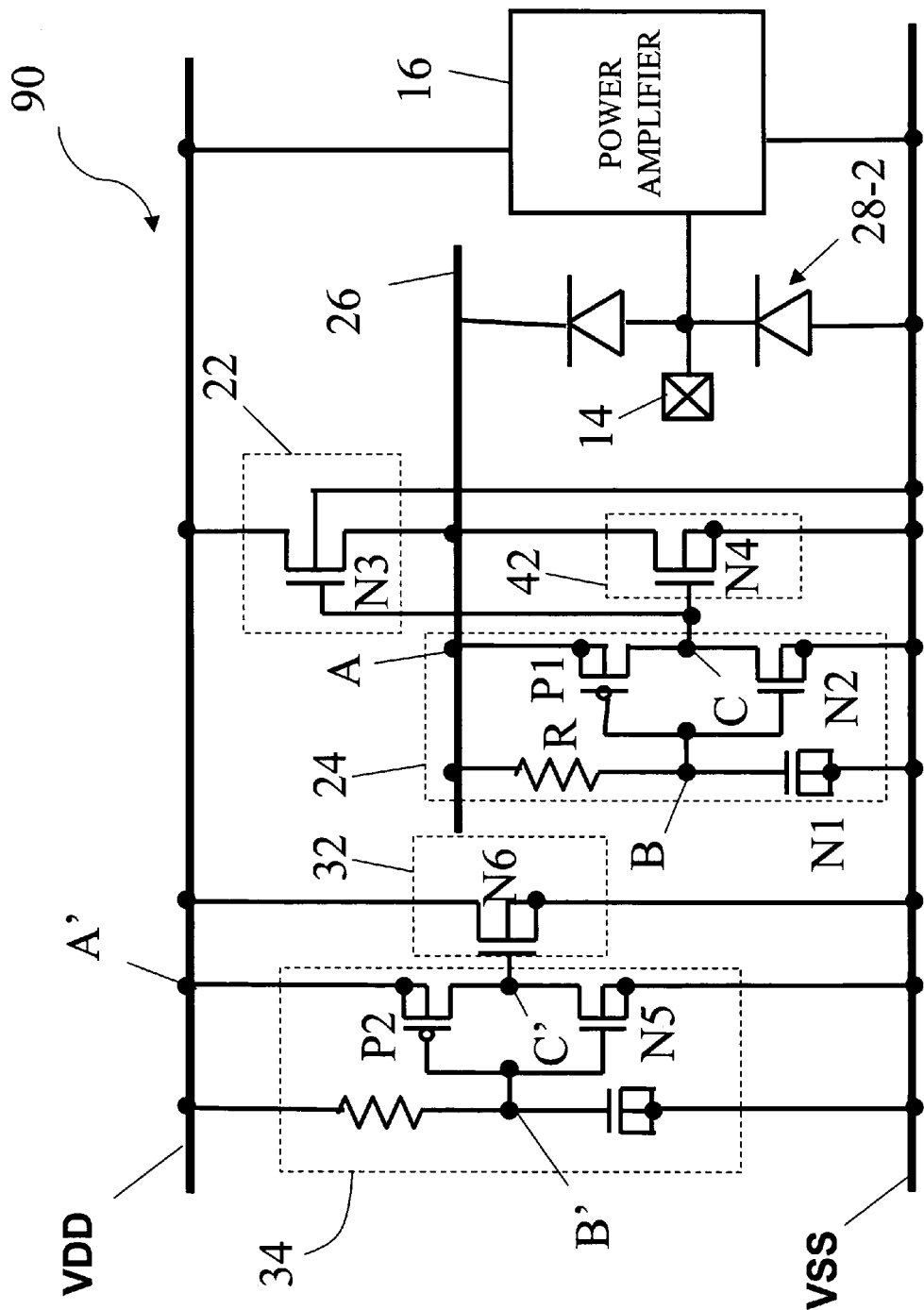
FIG. 7A is a circuit diagram of a circuit for ESD protection in accordance with an embodiment of the present invention.

FIG. 7A is a circuit diagram of a circuit 90 for ESD protection in accordance with an embodiment of the present invention. Referring to FIG. 7A, clamp circuits 22 and 42 include NMOS transistors labeled N3 and N4, respectively. Detecting circuit 24 includes an RC circuit and a complementary metal-oxide-semiconductor ("CMOS") circuit formed in parallel with the RC circuit. The RC circuit includes a resistor labeled R and an NMOS transistor labeled N1. NMOS transistor N1 includes a gate (not numbered) coupled to one end B of resistor R, and a source, a substrate and a drain (not numbered) coupled together to second power line VSS. NMOS transistor N1 functions to serve as a capacitor. The CMOS circuit includes PMOS transistor labeled P1 and an NMOS transistor labeled N2. The gates (not numbered) of PMOS transistor P1 and NMOS transistor N2 are coupled together to end B of resistor R. The drains (not numbered) of PMOS transistor P1 and NMOS transistor N2 are coupled to the gates (not numbered) of NMOS transistors N3 and N4.

In operation, when an ESD event occurs on conductive pad 14, due to an RC delay effect, the voltage level at point B ($V_B$) rises more slowly than that at a point A ($V_A$), i.e., $V_B < V_A$, where $V_B$ and $V_A$ are also a gate voltage level and a source voltage level of PMOS transistor P1, respectively. As a result, PMOS transistor P1 is turned on and NMOS transistor N2 is turned off. The voltage level at a point C ($V_C$) is pulled to $V_A$, which turns on NMOS transistors N3 and N4. An ESD current due to the ESD event is conducted from conductive pad 14 through clamp circuit 22 to first power line VDD, or through clamp circuit 42 to second power line VSS. During normal operation, $V_A$ is substantially equal to $V_B$, which turns off PMOS transistor P1 and turns on NMOS transistor N2. The voltage level $V_C$ is pulled to VSS, which turns off NMOS transistors N3 and N4. Clamp circuits 22 and 42 are kept in an off state during normal operation.

Circuit 90 further includes clamp circuit 32 and detecting circuit 34, which have a similar circuit structure to clamp circuit 22 and detecting circuit 24, respectively. In operation, when an ESD event occurs on first power line VDD, due to an RC delay effect, the voltage level at a point B' ($V_{B'}$) rises more slowly than that at a point A' ($V_{A'}$), i.e., $V_{B'} < V_{A'}$, which turns on a PMOS transistor labeled P2 and turns off an NMOS transistor labeled N5. The voltage level at a point C' ($V_{C'}$) is pulled to $V_{A'}$, which turns on an NMOS transistor N6 of clamp circuit 32. An ESD current due to the ESD event is conducted from first power line VDD through clamp circuit 32 to second power line VSS.

Figure 7B:
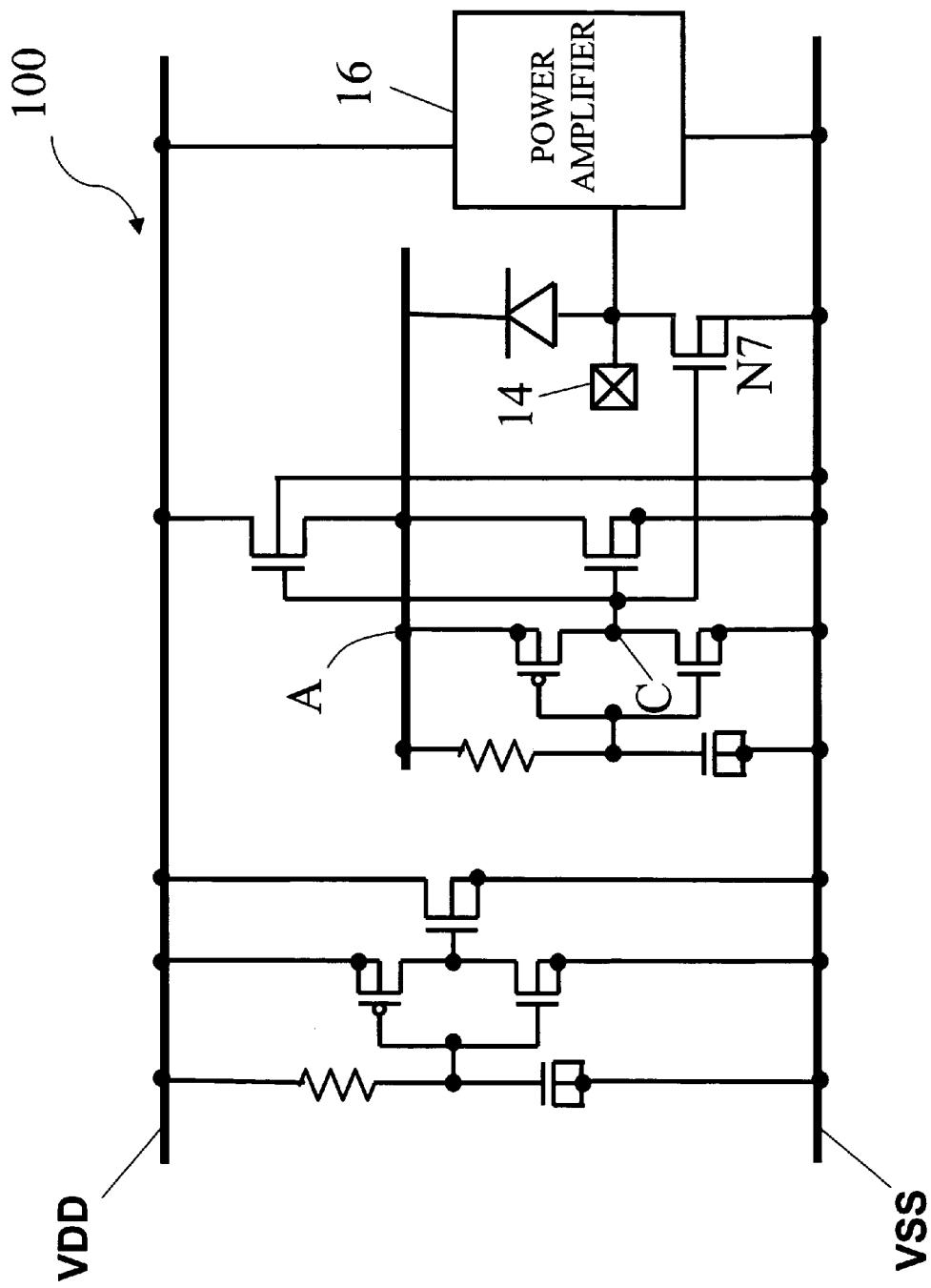
FIG. 7B is a circuit diagram of a circuit for ESD protection in accordance with another embodiment of the present invention.

FIG. 7B is a circuit diagram of a circuit 100 for ESD protection in accordance with another embodiment of the present invention. Circuit 100 has a similar structure to circuit 90 shown in FIG. 7A except that an NMOS transistor labeled N7 is used instead of second diode 28-2. In operation, when an ESD event occurs on conductive pad 14, $V_C$ is pulled to $V_A$, which turns on NMOS transistor N7. An ESD current due to the ESD event is conducted from conductive pad 14 through NMOS transistor N7 to second power line VSS.

Figure 8A:
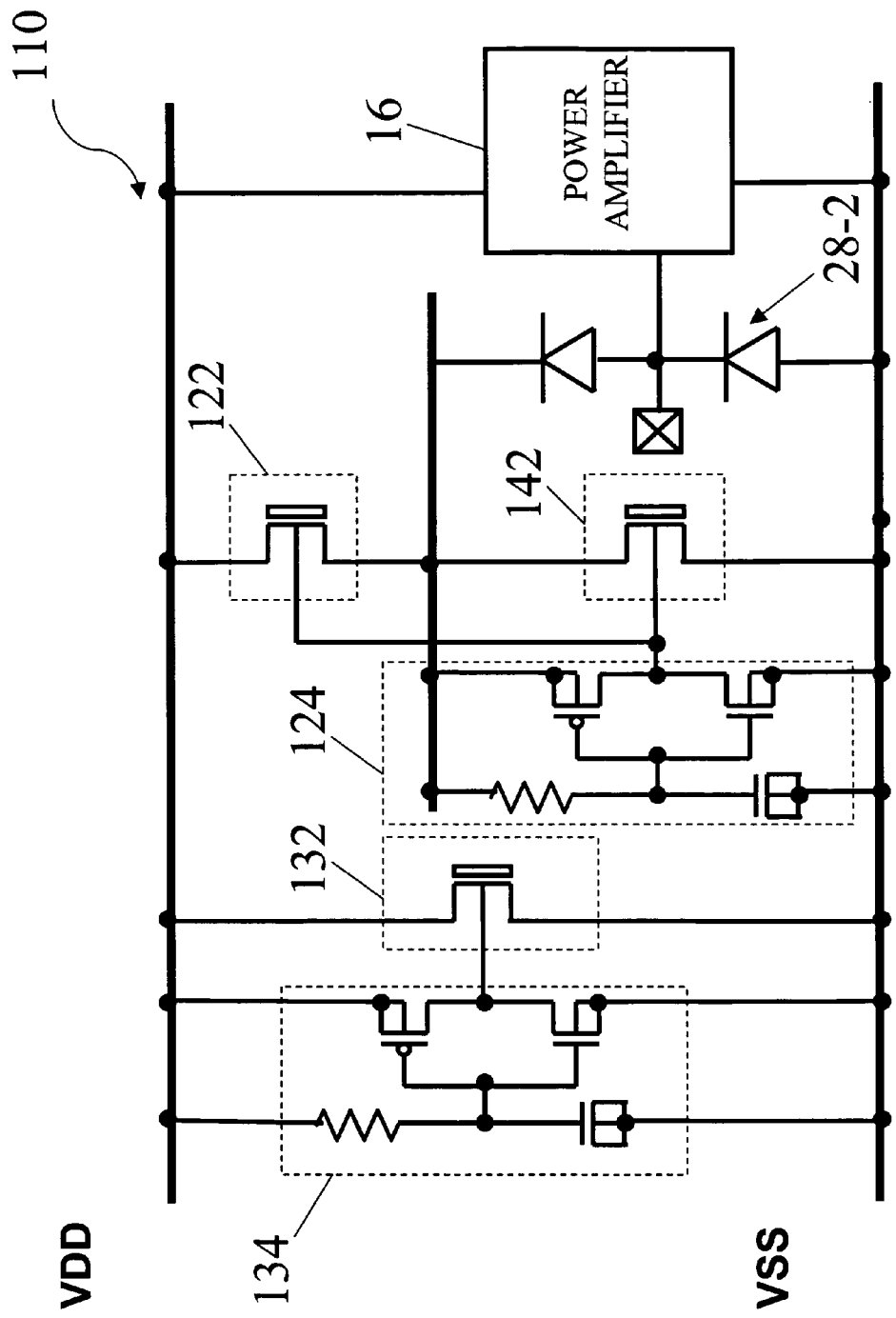
FIG. 8A is a circuit diagram of a circuit for ESD protection in accordance with an embodiment of the present invention.

FIG. 8A is a circuit diagram of a circuit 110 for ESD protection in accordance with an embodiment of the present invention. Circuit 110 has a similar structure to circuit 90 shown in FIG. 7A except that in a clamp circuit a field oxide device ("FOD") is used instead of a MOS transistor. Referring to FIG. 8A, circuit 110 includes clamp circuits 122, 132 and 142, and detecting circuits 124 and 134. Each of clamp circuits 122, 132 and 142 includes an FOD. An FOD is a substrate-triggered device and has better ESD robustness than a MOS device. An example of such an FOD is described in U.S. Pat. No. 5,744,842 to Ker, one of the inventors of the present invention, entitled "Area-Efficient VDD-to-VSS ESD Protection Circuit."

Figure 8B:
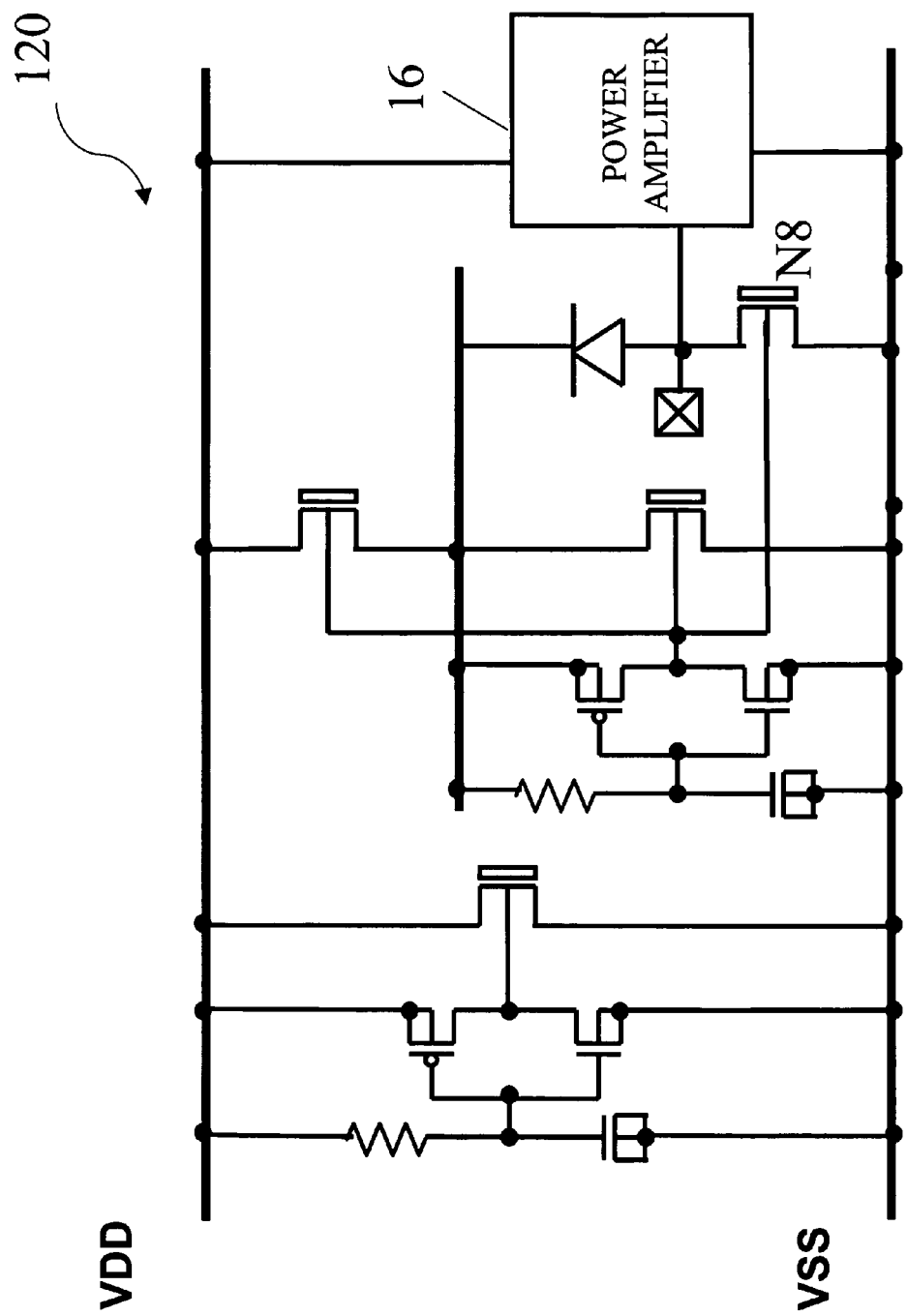
FIG. 8B is a circuit diagram of a circuit for ESD protection in accordance with another embodiment of the present invention.

FIG. 8B is a circuit diagram of a circuit 120 for ESD protection in accordance with another embodiment of the present invention. Circuit 120 has a similar structure to circuit 110 shown in FIG. 8A except that an FOD labeled N8 is used instead of second diode 28-2. The function and object of FOD N8 are similar to those of FOD 122, 132 or 142 shown in FIG. 8A and therefore are not discussed.

Figure 9A:
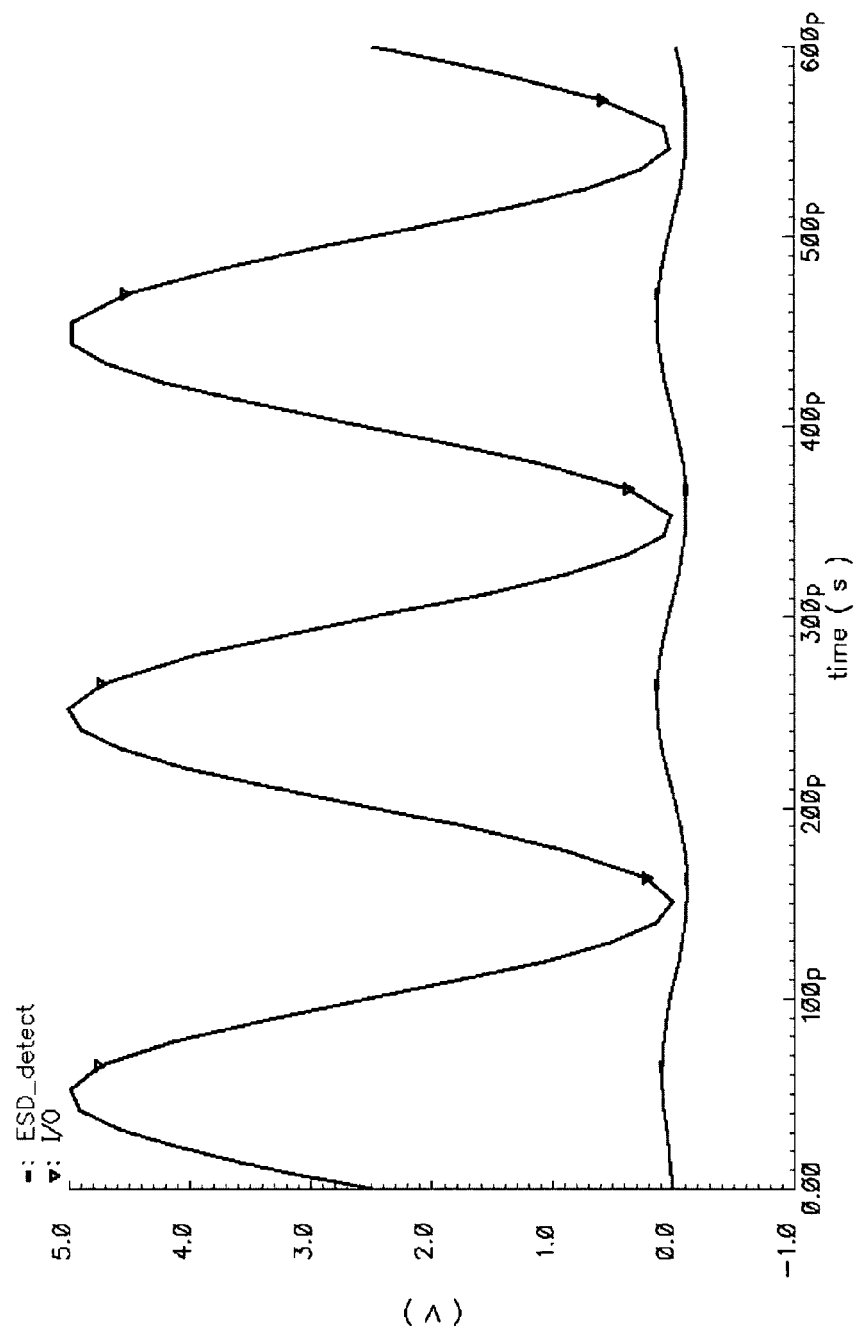
FIG. 9A is a plot showing a simulation result of a circuit for ESD protection in accordance with an embodiment of the present invention.

FIG. 9A is a plot showing a simulation result of a circuit for ESD protection in accordance with an embodiment of the present invention. Referring to FIG. 9A, a sinusoidal wave having a peak-to-peak voltage level of approximately 5V is applied to a conductive pad 14 shown in, for example, FIG. 7A. The sinusoidal wave represents a voltage signal appears at conductive pad 14 during normal operation. The curve shown below the sinusoidal wave is an output voltage signal ($V_C$) from detecting circuit 24 shown in FIG. 7A. The voltage level $V_C$ is approximately 0V, smaller than a threshold voltage of 0.5V of NMOS transistor N3 or N4. Clamp circuits 22 and 42 are not turned on, which are expected so during normal operation.

Figure 9B:
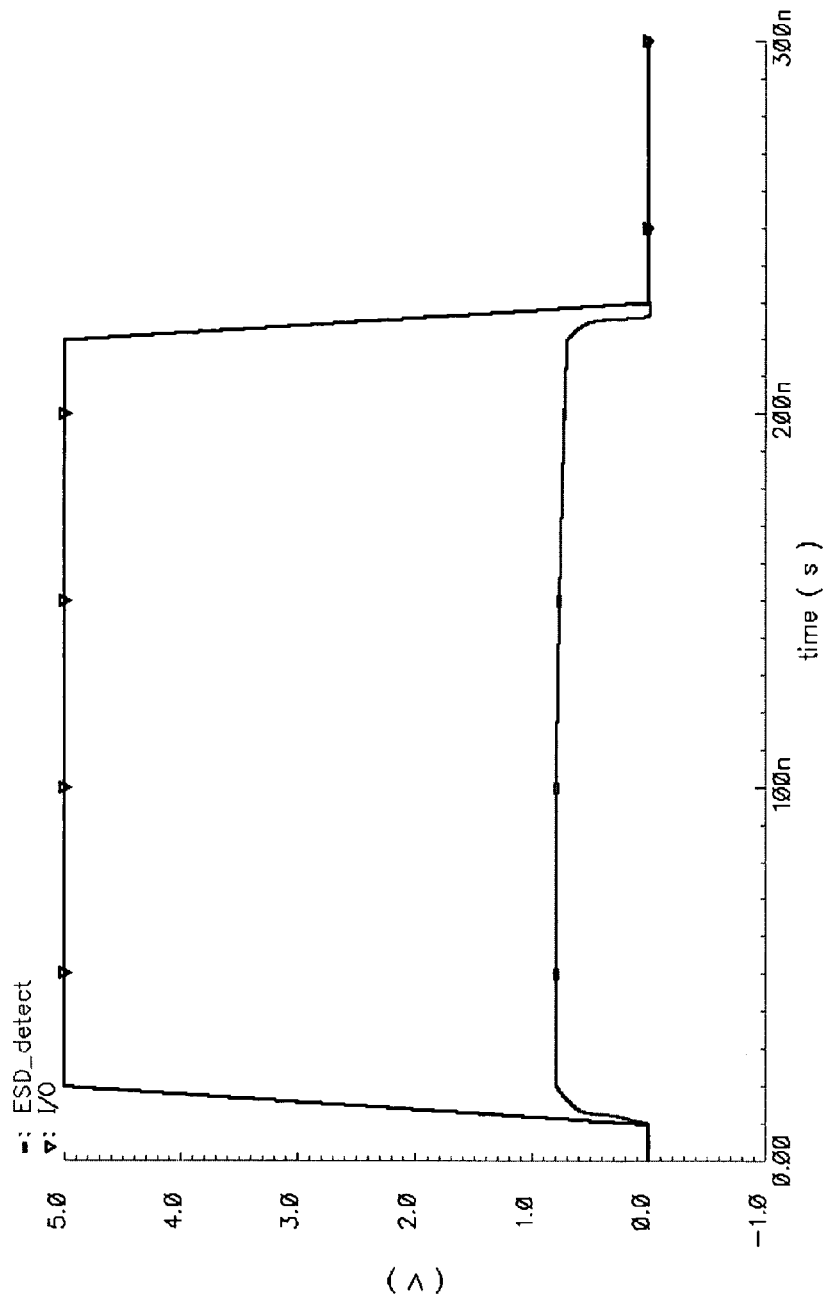
FIG. 9B is a plot showing a simulation result of a circuit for ESD protection in accordance with an embodiment of the present invention.

FIG. 9B is a plot showing a simulation result of a circuit for ESD protection in accordance with an embodiment of the present invention. Referring to FIG. 9B, a pulse having an amplitude of 5V and lasting about 220 nanoseconds (ns) is applied to conductive pad 14 shown in FIG. 7A. The pulse represents an ESD event. The output voltage level $V_C$ from detecting circuit 24 is approximately 0.8V, greater than a threshold voltage of 0.5V of NMOS transistor N3 or N4. Clamp circuits 22 and 24 are turned on to conduct an ESD current.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A circuit for protecting a power amplifier from electrostatic discharge (ESD), comprising:
   a connection line to conduct an ESD current, the connection line floats during normal operation of the power amplifier;
   a first diode connected between the connection line and a conductive pad and coupled to the power amplifier and the connection line;
   a first clamp circuit connected between a first power line and the connection line, the first clamp circuit including a transistor that includes a substrate connected to a second power line;
   a second clamp circuit connected between the connection line and the second power line, the second clamp circuit including a transistor that includes a substrate connected to the second power line; and
   a detecting circuit connected between the connection line and the second power line for detecting whether an ESD event occurs at the conductive pad,
   wherein the detecting circuit activates the first clamp circuit in response to an ESD event to conduct an ESD current to the first power line, and activates the second clamp circuit in response to the ESD event to conduct the ESD current to the second power line, and
   wherein the first and second clamp circuits are connected independently of one another between the first power line and the connection line and between the connection line and the second power line, respectively.

2. The circuit of claim 1, further comprising a diode coupled between the conductive pad and the second power line.

3. The circuit of claim 1, further comprising a diode string coupled in series between the connection line and the conductive pad.

4. The circuit of claim 1, further comprising a diode coupled between the first power line and the connection line.

5. The circuit of claim 1, further comprising a metal-oxide-semiconductor (MOS) transistor connected between the first power line and the connection line including a gate coupled to the connection line.

6. The circuit of claim 1, further comprising a MOS transistor connected between the first power line and the connection line including a gate coupled to the first power line.

7. The circuit of claim 1, wherein the first clamp circuit includes one of a MOS transistor or a field oxide device (FOD).

8. The circuit of claim 1, further comprising a third clamp circuit connected between the first and second power lines.

9. The circuit of claim 8, wherein the clamp circuit connected between the first and second power lines includes one of a MOS transistor or an FOD.

10. The circuit of claim 8, further comprising a detecting circuit connected between the first and second power lines for detecting whether an ESD event occurs on the first power line.

11. The circuit of claim 10, wherein the detecting circuit connected between the first and second power lines activates the third clamp circuit in response to an ESD event to conduct an ESD current from the first power line to the second power line.

12. The circuit of claim 1, wherein the second clamp circuit includes one of a MOS transistor or an FOD.

13. The circuit of claim 1, wherein the detecting circuit includes an RC delay circuit.

14. The circuit of claim 1, further comprising one of a MOS transistor or a field oxide device (FOD) connected between the conductive pad and the second power line.

15. The circuit of claim 14, wherein the detecting circuit connected between the connection line and the second power line activates the MOS transistor or FOD to conduct an ESD current from the conductive pad to the second power line.

16. The circuit of claim 1, wherein the ESD current conducted by the first clamp circuit is not conducted by the second clamp circuit and the ESD current conducted by the second clamp circuit is not conducted by the first clamp circuit.

17. A circuit for protecting a power amplifier from electrostatic discharge (ESD), comprising:
   a connection line capable to conduct an ESD current, the connection line floats during normal operation of the power amplifier;
   a first diode connected between a conductive pad and coupled to the power amplifier and the connection line;
   a first clamp circuit connected between a first power line and the connection line, the first clamp circuit including a transistor that includes a substrate connected to a second power line;
   a second clamp circuit connected between the second power line and the connection line, the second clamp circuit including a transistor that includes a substrate connected to the second power line;
   a third clamp circuit connected between the first power line and the second power line;
   a first detecting circuit connected between the connection line and the second power line for detecting whether an ESD event occurs at the conductive pad, and activating the first clamp circuit in response to the ESD event to conduct an ESD current to the first power line, and activating the second clamp circuit in response to the ESD event to conduct the ESD current to the second power line; and
   a second detecting circuit connected between the first and second power lines for detecting whether an ESD event occurs on the first power line, and activating the third clamp circuit in response to the ESD event to conduct an ESD current to the second power line,
   wherein the first and second clamp circuits are connected independently of one another between the first power line and the connection line and between the connection line and the second power line, respectively, and the ESD current conducted by the first clamp circuit is not conducted by the second clamp circuit and the ESD current conducted by the second clamp circuit is not conducted by the first clamp circuit.

18. The circuit of claim 17, further comprising one of a MOS transistor or a field oxide device (FOD) connected between the conductive pad and the second power line.

19. The circuit of claim 18, wherein the first detecting circuit activates the MOS transistor or FOD to conduct an ESD current from the conductive pad to the second power line.

20. The circuit of claim 17, wherein each of the first, second and third clamp circuits includes one of a MOS transistor or an FOD.

21. The circuit of claim 17, wherein each of the first and second detecting circuit includes an RC delay circuit.

22. The circuit of claim 17 further comprising a diode coupled between the conductive pad and the second power line.

23. A method for protecting a power amplifier from electrostatic discharge (ESD), comprising:
   providing a first power line and a second power line;
   providing a connection line between the first and second power lines, the connection line being configured to conduct an ESD current and to float during normal operation of the power amplifier;
   connecting a first clamp circuit between the first power line and the connection line, the first clamp circuit including a transistor that includes a substrate connected to the second power line;
   connecting a second clamp circuit between the connection line and the second power line such that the first and second clamp circuits are connected independently of one another between the first power line and the connection line and between the connection line and the second power line, respectively, the second clamp circuit including a transistor that includes a substrate connected to the second power line;
   connecting a detecting circuit between the connection line and the second power line;
   coupling a conductive pad to the power amplifier;
   providing a first diode connected between the conductive pad and the connection line;
   detecting whether an ESD event occurs at the conductive pad;
   activating the first clamp circuit when an ESD event is detected;
   conducting a first ESD current from the conductive pad through the connection line to the first power line, the first ESD current not conducted by the second clamp circuit;
   activating the second clamp circuit when an ESD event is detected; and conducting a second ESD current from the conductive pad through the connection line to the second power line, the second ESD current not conducted by the first clamp circuit.

24. The method of claim 23, further comprising connecting a clamp circuit between the first and second power lines.

25. The method of claim 24, further comprising connecting a detecting circuit between the first and second power lines for detecting whether an ESD event occurs on the first power line.

26. The method of claim 25, further comprising: activating the clamp circuit connected between the first and second power lines if an ESD event on the first power line is detected; and conducting an ESD current from the first power line to the second power line.

27. The method of claim 23, further comprising connecting a MOS transistor between the conductive pad and the second power line.

28. The method of claim 27, further comprising:
   activating the MOS transistor if an ESD event on the conductive pad is detected; and
   conducting an ESD current directly from the conductive pad to the second power line.

29. The method of claim 23, further comprising:
   coupling a diode between the first power line and the connection line; and
   clamping the connection line at a fixed voltage level.

30. The method of claim 23, further comprising:
   connecting a MOS transistor between the first power line and the connection line; and
   clamping the connection line at a fixed voltage level.

31. The method of claim 23 further comprising providing a diode coupled between the conductive pad and the second power line.

32. A circuit for protecting a power amplifier from electrostatic discharge (ESD), comprising:
   a connection line to conduct an ESD current, the connection line floats during normal operation of the power amplifier;
   a first diode connected between a conductive pad and coupled to the power amplifier and the connection line;
   a first clamp circuit connected between a first power line and the connection line, the first clamp circuit including a transistor that includes a substrate connected to a second power line;
   a second clamp circuit connected, independently of the first clamp circuit, between the second power line and the connection line, the second clamp circuit including a transistor that includes a substrate connected to the second power line;
   a third clamp circuit connected between the first power line and the second power line;
   a first detecting circuit connected between the connection line and the second power line for detecting whether an ESD event occurs at the conductive pad, and activating the first clamp circuit in response to the ESD event to conduct an ESD current to the first power line;
   a second detecting circuit connected between the first and second power lines for detecting whether an ESD event occurs on the first power line, and activating the third clamp circuit in response to the ESD event to conduct an ESD current to the second power line; and
   one of a MOS transistor or a field oxide device (FOD) connected between the conductive pad and the second power line,
   wherein the first detecting circuit activates the MOS transistor or FOD to conduct an ESD current from the conductive pad to the second power line, and
   wherein the first and second clamp circuits are connected independently of one another between the first power line and the connection line and between the connection line and the second power line, respectively.

33. The circuit of claim 32 further comprising a diode coupled between the conductive pad and the second power line.

* * * * *